(12) United States Patent
Wilshaw et al.

(10) Patent No.: US 9,293,329 B2
(45) Date of Patent: Mar. 22, 2016

(54) PROCESSING A WAFER FOR AN ELECTRONIC CIRCUIT

(75) Inventors: Peter Wilshaw, Oxford (GB); Kanad Mallik, Oxford (GB); Doug Jordan, Chelmsford (GB)

(73) Assignee: Isis Innovation Limited (GB)

( * ) Notice: Subject to any disclaimer, the term of this patent is extended or adjusted under 35 U.S.C. 154(b) by 99 days.

(21) Appl. No.: 14/110,108

(22) PCT Filed: Apr. 4, 2012

(86) PCT No.: PCT/GB2012/050760
§ 371 (c)(1),
(2), (4) Date: Nov. 8, 2013

(87) PCT Pub. No.: WO2012/137000
PCT Pub. Date: Oct. 11, 2012

(65) Prior Publication Data
US 2014/0291815 A1    Oct. 2, 2014

(30) Foreign Application Priority Data

| Apr. 6, 2011 | (GB) | .................................. 1105857.5 |
| Apr. 6, 2011 | (GB) | .................................. 1105859.1 |
| Apr. 6, 2011 | (GB) | .................................. 1105862.5 |

(51) Int. Cl.
*H01L 21/22* (2006.01)
*H01L 21/322* (2006.01)
(Continued)

(52) U.S. Cl.
CPC ........ *H01L 21/225* (2013.01); *H01L 21/02381* (2013.01); *H01L 21/22* (2013.01); *H01L 21/2605* (2013.01); *H01L 21/26506* (2013.01); *H01L 21/324* (2013.01); *H01L 21/3225* (2013.01); *H01L 21/3226* (2013.01); *H01L 29/16* (2013.01); *H01L 29/2003* (2013.01);
(Continued)

(58) Field of Classification Search
CPC .. H01L 21/22; H01L 21/3225; H01L 21/3226
See application file for complete search history.

(56) References Cited

U.S. PATENT DOCUMENTS

2007/0175385 A1    8/2007  Kurita
2010/0224968 A1    9/2010  Kurita

FOREIGN PATENT DOCUMENTS

| WO | 0055397 A1    | 9/2000 |
| WO | 02084728 A1   | 10/2002 |
| WO | 2009034362 A1 | 3/2009 |

OTHER PUBLICATIONS

'Semi-insulating silicon using deep level impurity soping: problems and potential', Mallik et al., Semicond. Sci. Technol., vol. 18, pp. 517-524 (2003).

(Continued)

*Primary Examiner* — Phat X Cao
(74) *Attorney, Agent, or Firm* — Snell & Wilmer L.L.P.

(57) ABSTRACT

According to a disclosed embodiment, there is provided a method of processing a silicon wafer for use in a substrate for an electronic circuit, comprising: impregnating the silicon wafer with impurities that form one or more deep energy levels within the band gap of silicon, wherein at least one of said deep energy levels is positioned at least 0.3 eV away from the conduction band if the level is a donor level or at least 0.3 eV away from the valence band if the level is an acceptor level; and pre-processing the silicon wafer, prior to or after said impregnation step, so that precipitation of oxide during, after, or during and after, said impregnating step is suppressed.

16 Claims, 2 Drawing Sheets

(51) Int. Cl.
*H01L 21/225* (2006.01)
*H01L 21/26* (2006.01)
*H01L 21/265* (2006.01)
*H01L 29/36* (2006.01)
*H01L 21/02* (2006.01)
*H01L 29/16* (2006.01)
*H01L 29/20* (2006.01)
*H01L 29/225* (2006.01)
*H01L 29/267* (2006.01)
*H01L 21/324* (2006.01)

(52) U.S. Cl.
CPC ............ *H01L 29/225* (2013.01); *H01L 29/267* (2013.01); *H01L 29/36* (2013.01)

(56) References Cited

OTHER PUBLICATIONS

Benda V Ed—Capasso F: "Carrier lifetime control in power semiconductor devices", Physics of Semiconductor Devices, 2007. IWPSD 2007. International Workshop on, IEEE, Piscataway, NJ, USA, Dec. 16, 2007.

Choe K S et al: "Minority-carrier lifetime optimization in silicon MOS devices by intrinsic geltering". Journal of Crystal Growth, Elsevier, Amsterdam, NL, vol. 218, No. 2-4, Sep. 15, 2000, pp. 239-244.

Wang R et al: "Semi-insulating silicon substrates for silicon based RF integrated circuits", Silicon Monolithic Integrated Circuits In Rf Systems, 1998. Digest of Papers. 1998 Topical Meeting on Ann Arbor, MI, USA Sep. 17-18, 1998, Piscataway NJ, USA, IEEE, US, Sep. 17, 1998, pp. 164-168.

Abuelgasim, A., Mallik, Kanad, Ashburn, P. and De Groot, C. H. (2011) Fabrication of low loss coplanar waveguides on gold-doped Czochralski-silicon. In, Bioelectronics, Biomedical, and Bioinspired Systems V; and Nanotechnology V. Bellingham, US, The International Society for Optical Engineering, 806811. (Proceedings of SPIE, 8068). (doi:10.1117/12.886552).

Abuelgasim, Ahmed, Mallik, Kanad, De Groot, Kees, Ashburn, Peter, Jordan, D.M. and Wilshaw, P.R. (2010) High-resistivity Czochralski-silicon using Deep Level Doping Compensation. Poster. ESSDERC 2010, Sevilla, Spain.

Abuelgasim, Ahmed, Mallik, Kanad, De Groot, Kees, Ashburn, Peter, Jordan, D.M. and Wilshaw, P.R. (2010) High-resistivity Czochralski-silicon using Deep Level Doping Compensation. Extended Abstract. ESSDERC 2010, Sevilla, Spain.

PROCESSING A WAFER FOR AN ELECTRONIC CIRCUIT

CROSS-REFERENCE TO RELATED APPLICATIONS

The present application is a U.S. National Stage entry under 35U.S.C. §371of International Application No. PCT/GB2012/050760, filed on Apr. 4, 2012, which claims the benefit of United Kingdom application 1105857.5, filed on Apr. 6, 2011; United Kingdom application 1105859.1, filed on Apr. 6, 2011; and United Kingdom application 1105862.5, filed on Apr. 6, 2011.

FIELD

The present invention relates to a silicon wafer for use in the fabrication of electronic devices, for example semiconductor devices, particularly high frequency and/or high power electronic devices, and processing methods for improving the properties of the silicon wafer.

BACKGROUND

Single crystal silicon grown by the Czochralski (Cz) technique is currently the most widely used semiconductor material for integrated circuits (ICs) in most applications. However, for higher frequency technologies, group III-V materials are generally preferred. This has meant that products such as mobile phones, which require both high and low frequency circuitry, are often constrained to using a hybrid arrangement, with group III-V semiconductors for the high frequency processes (e.g. front end signal processing in mobile phones) and silicon for the rest of the functionality of the device. Hybrid circuitry using group III-V semiconductors is complex and relatively expensive compared with solutions based on silicon wafers only. Group III-V materials also generally offer inferior thermal conductivity properties compared with silicon.

Recent improvements in silicon processing have led to an increase in the speed at which individual silicon devices can operate efficiently and the point has now been reached where individual Si-based devices are capable of operating at speeds approaching those of their III-V counterparts. However, using conventional production techniques, it is difficult to avoid the presence of background carriers in the silicon wafers, which leads to a reduced resistivity of the wafer. However high resistivity substrates are required for reducing transmission line losses, making high-Q inductors and minimising substrate crosstalk in high frequency applications and monolithic circuits. This degradation in the characteristics effectively prevents the use of silicon wafers for many high frequency devices.

To tackle these problems, several special processes have been described in the prior art for producing high resistivity substrates. These include the so-called float-zone (FZ) method for producing very high purity silicon and the "silicon-on-anything" (SOA) constructions in which a material other than a silicon wafer is used for the "handle" or base layer of the substrate (which is where most of the microwave power is absorbed).

Silicon wafers produced using the float-zone method can have resistivities of the order of 10 kΩcm or more, but their maximum diameter is typically limited to about 150 mm. This is unsuitable for modern VLSI technology where the standard wafer diameter is 300 mm. The other major problem of float zone wafers is the absence of oxygen, which internally getters metallic impurities in the substrate during device processing and improves reliability. Thus, float-zone substrates tend to have less reliable properties. There are also attempts to make high resistivity Cz silicon but these are presently limited to around 1 kΩcm and are more expensive than conventional Cz silicon wafers.

The use of thin films of GaN on silicon handle wafers is known for high power, high frequency architectures, but such approaches use relatively expensive float zone silicon.

The SOA technology uses an insulating material like quartz or glass for the handle layer instead of a silicon wafer, which has very different physical and thermal properties than silicon. This means processing apparatus and methods need to be adapted to the particular characteristics of the SOA devices. A further problem is the relatively high thermal resistances these devices present, which can be of the order of 15000 K/W rather than the usual 100 K/W. This can lead to substantial self-heating effects during operation and thermal runaway of devices even at low power levels.

Semicond. Sci. Technol. 18 (2003) 517-524 describes the use of deep level impurities to obtain "semi-insulating" (high resistivity) Czochralski (Cz) silicon. This academic study investigates values of deep impurity levels and their concentrations that are suitable for raising the resistivity of the silicon to near intrinsic levels. No details regarding commercial application of the technology are disclosed. Furthermore, the skilled person would be strongly disinclined to use the kind of impurities that act to increase the resistivity of silicon anywhere in a semiconductor manufacturing facility because of the risk of contamination of silicon device layers, which is known to seriously damage or destroy their performance.

WO 2009/034362 A1 discloses the use of deep level impurities to increase the resistivity of a substrate for high frequency circuits, but requires full encapsulation of the substrate, and/or of a device layer mounted on the substrate, by a diffusion barrier layer. Furthermore, substrates manufactured according to the teaching of WO 2009/034362 A1 can be sensitive to certain heat treatments that may be applied after the deep level impurities have been introduced into the substrate, for example to manufacture other elements of the electronic device of which the substrate is to be a part, or during operation of the electronic device. The subsequent heat treatments may cause the resistivity of the substrate to fall, in many cases to an unpredictable extent, which may reduce performance and/or affect reliability. It has also been found that a given process for impregnating a substrate with deep level impurities can result in a range of different resistivities, which hampers reliability and manufacturing efficiency (yield).

SUMMARY

In the description which follows, reference to "silicon wafer" is understood to encompass both a whole (undiced) silicon wafer and a portion of a silicon wafer (for example a diced portion of a whole silicon wafer).

It is an object of the present invention to address at least some of the problems discussed above in relation to the prior art.

According to an aspect of the invention, there is provided a method of processing a silicon wafer for use in a substrate for an electronic circuit, comprising: impregnating the silicon wafer with impurities that form one or more deep energy levels within the band gap of silicon, wherein at least one of said deep energy levels is positioned at least 0.3 eV away from the conduction band if the level is a donor level or at least 0.3 eV away from the valence band if the level is an acceptor level; and pre-processing the silicon wafer, prior to or after said impregnation step, so that precipitation of oxide during, after, or during and after, said impregnating step is suppressed.

Obviously, in the case where the pre-processing is carried out exclusively after the impregnation step, the precipitation is only suppressed by the pre-processing in respect of the time period after the impregnation step (e.g. during subsequent device processing steps, such as formation of device layers or bonding steps).

The inclusion of impurities that form deep energy levels ("deep level impurities") raises the resistivity of the silicon wafer layer and reduce the absorption of microwave power in high frequency applications by reducing the concentration of free carriers present in the material. High frequency circuits manufactured using such wafers do not therefore suffer the same reduction in performance that is known in single crystal wafers that do not contain such impurities. Thus, devices comprising high and low frequency parts can be made entirely using silicon-based substrates, thus obviating the need for hybrid circuitry and thereby achieving greater simplicity and reduced cost of manufacture.

Embodiments of the present invention provide an improvement over arrangements which rely on very low doped (and thus high resistivity) float zone silicon for the substrate. In such systems, free charges can be induced by the presence of fields produced by operation of the high frequency electronic circuit. These fields tend to move the band edge in the silicon wafer closer to the Fermi level and so induce free carriers, which in turn lower the resistivity of the material. The substrates according to embodiments of the present invention may be resistant to the formation of such carriers because the deep level impurities act to "pin" the Fermi level close to the centre of the gap.

Pre-processing the silicon wafer to suppress precipitation of oxide during, after, or during and after, the impregnating step helps to improve reliability. In particular, the pre-processing helps to ensure that the performance of the silicon wafer, for example the resistivity of the silicon wafer and/or the stability of the resistivity with respect to processing steps subsequent to the impregnation, is at a satisfactory level, regardless of the thermal history of the silicon wafer prior to the pre-processing.

In the absence of the pre-processing, the performance of the silicon wafer can vary significantly as a function of the thermal history of the silicon wafer. For example, where the silicon wafer is produced using the Czochralski method or similar, oxygen is introduced from the quartz crucible from which the ingot is grown. Due to the high temperature of the ingot, the oxygen is supersaturated and, over time, oxide clusters/nuclei will form within the silicon. For a given silicon wafer, the concentration and size of oxide clusters/nuclei will depend on the thermal history of the portion of the ingot from which the silicon wafer is taken. Wafers from the leading end of the ingot will tend to have been maintained at a high temperature for a longer period of time than silicon wafers from the trailing end of the ingot, which is formed at a later time (and thus nearer to the end of the high temperature growth process). The concentration and size of oxide clusters/nuclei will thus tend to be higher for silicon wafers from the leading end of the ingot compared with those from the trailing end, and, more generally, the concentration will tend to vary smoothly as a function of longitudinal position along the ingot.

The presence of oxide clusters/nuclei can affect the resistivity of the silicon wafer by causing precipitation of oxide during the impregnation process, which can reduce the amount of deep level impurity that is introduced, and/or by causing precipitation of oxide after the impregnation process, for example during subsequent processing steps that result in the silicon wafer being exposed to temperatures that are sufficiently high to cause precipitation, which will tend to cause the deep level impurities to be pushed off the substitutional sites where they are electronically active (the precipitation of oxide in Si generates self interstitials which tend to replace the deep level impurities on the substitutional sites). The extent to which these effects occur depends on the concentration and size of the oxide clusters/nuclei and therefore on the thermal history of the silicon wafer.

The pre-processing of embodiments of the present invention avoids this undesirable dependence on the thermal history of the silicon wafer by modifying the state of the silicon wafer such that the level of precipitation of oxide at later stages is reduced (suppressed).

The pre-processing may involve a heat treatment to remove substantially all of the oxide clusters/nuclei present. Alternatively or additionally, the pre-processing may involve a heat treatment that precipitates substantially all of the oxygen in the silicon wafer as oxide, so that there is none left to precipitate during the impregnation or subsequent processing.

The inventors have recognized that processing at elevated temperatures (such as the temperatures that would be used in typical device manufacturing steps) of silicon doped with deep level impurities, for example Au, can cause a thin deep-level impurity rich layer to be produced at the surface of the material. Optionally, after the impregnation step: a layer at the surface of the silicon wafer (e.g. comprising the deep-level impurity only or a mixture of the deep-level impurity and silicon) is removed by etching and/or an anneal is performed that redistributes impurities away from a surface layer (e.g. an anneal at about 1150 degrees C. for a short period, for example about two to five minutes, followed by rapid cooling, for example at about 40 degrees C. per minute or more for at least a proportion of the cooling, for example down to about 650 degrees C.). The etching and/or anneal reduces the concentration of deep-level impurities on or near the surface and reduces any deleterious effect on performance.

According to an alternative aspect of the invention, there is provided a device manufacturing method, comprising the following steps: impregnating a silicon wafer with impurities that form one or more deep energy levels within the band gap of silicon, wherein at least one of said deep energy levels is positioned at least 0.3 eV away from the conduction band if the level is a donor level or at least 0.3 eV away from the valence band if the level is an acceptor level; and forming a device layer comprising electronically functional components, wherein: the silicon wafer is pre-processed, prior to or after said impregnating step, so that precipitation of oxide during, after, or during and after, said impregnating step is suppressed.

According to an alternative aspect of the invention, there is provided a method of processing a silicon wafer for use in a substrate for an electronic circuit, comprising: impregnating the silicon wafer with impurities that form one or more deep energy levels within the band gap of silicon, wherein at least one of said deep energy levels is positioned at least 0.3 eV away from the conduction band if the level is a donor level or at least 0.3 eV away from the valence band if the level is an acceptor level, wherein: the silicon wafer is formed from silicon grown using the magnetic Czochralski method.

Wafers grown according to the magnetic Czochralski method have lower levels of oxygen and are particularly advantageous where Au is used as the deep-level impurity because the rate of injection of self interstitials, which tend to displace Au atoms from substitutional sites, is reduced.

According to an alternative aspect of the invention, there is provided a device manufacturing method, comprising the following steps: impregnating a silicon wafer with impurities that form one or more deep energy levels within the band gap of silicon, wherein at least one of said deep energy levels is positioned at least 0.3 eV away from the conduction band if the level is a donor level or at least 0.3 eV away from the valence band if the level is an acceptor level; and forming a device layer comprising electronically functional components, wherein: the silicon wafer is formed from silicon grown using the magnetic Czochralski method.

DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

As has been discussed above, at high frequencies silicon wafers become problematic because of high absorption of microwave power by background free carriers of the material, causing a reduction in the performance of the complete circuit.

Silicon has a relatively low band gap of 1.12 eV at room temperature, which sets its intrinsic (100% pure material) free carrier concentration at $10^{10}$ cm$^{-3}$ and hence its nominal resistivity at 300 kΩcm or greater. However, it is extremely difficult to avoid background impurities being incorporated into the silicon during single crystal growth (particularly with the otherwise highly favourable Czochralski (Cz) growth method), and in practice it is very challenging to reduce the free carrier concentration much below $10^{13}$ cm$^{-3}$.

For radio frequency CMOS devices operating up to around 2 GHz, special high resistivity silicon tends to be used, which has a resistivity of around 1 kΩcm. However, it has been shown that a silicon wafer resistivity of at least 1 kΩcm is required for satisfactorily low absorption loss and operation comparable with GaAs (a group III-V material) substrates, for example, operating at frequencies of more than a few MHz.

Embodiments disclosed herein may optionally include substrates of the "silicon-on-insulator" (SOI) type. These substrates comprise a silicon wafer layer, also known as a handle wafer, and an insulating layer on top of the silicon wafer and presenting an outer surface for a device layer, within which electronically functional elements of the device are to be formed. Where a high frequency device is to be formed in the device layer, it is the resistivity of the silicon wafer layer that is the determining factor in the absorption loss of the SOI circuit. The presence of the insulating layer, which separates the device layer from the silicon wafer layer may also be chosen to have diffusion barrier properties, which allows greater flexibility in modifying the properties of the silicon wafer layer without affecting or contaminating the devices made in the device layer.

An advantage of adapting SOI substrates to high frequency technology is that this field of technology is reaching maturity, and the use of SOI substrates is already routine and looks likely to become the industry standard for many future applications. In addition, unlike SOA substrates, SOI substrates are largely compatible with existing silicon processing tools (due to the much greater similarity of SOI substrates with standard silicon wafers (including their thermal properties for example).

The present invention is based on introducing deep level impurities into the wafer layers (e.g. the Cz silicon layers) of substrates (e.g. SOI substrates) in order to compensate the free carriers remaining after the single crystal growth process of the wafers. In this way, it is possible efficiently to produce wafers of extremely high resistivity (thus reducing absorption losses) and of dimensions and physical properties suitable for conventional semi-conducting processing systems.

Figure 1:
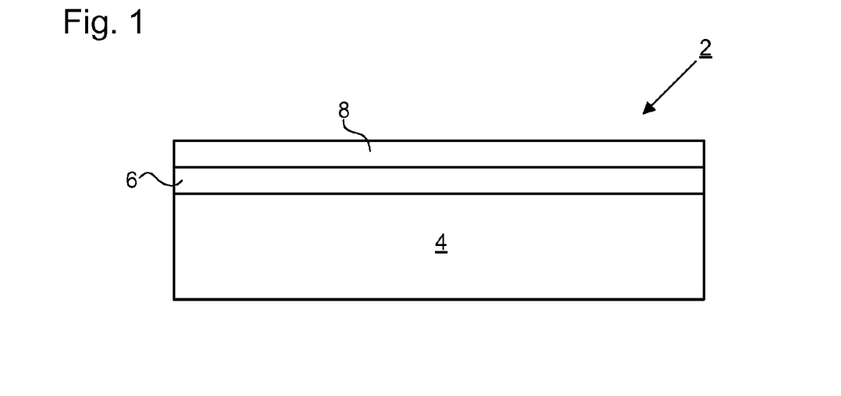
FIG. 1 is a schematic illustration of a substrate incorporating a silicon wafer processed according to an embodiment of the invention.

FIG. 1 is a schematic illustration showing the structure of a substrate 2 for an electronic circuit, comprising a silicon wafer layer 4 and an electrically insulating layer 6, formed on a surface of the silicon wafer layer 4. The insulating layer 6 provides a surface on which a device layer 8 may be formed (comprising device structures formed in a layer of high purity silicon, for example). In addition to being electrically insulating, the insulating layer 6 may have the property of inhibiting or preventing diffusion of impurities from one side of the layer to the other (i.e. rendering the rate of diffusion of the relevant impurities so slow that little or no impurity reaches the device layer 8, such that the device layer 8 is not significantly affected by contamination), in which case the insulating layer 6 may also be referred to as a "diffusion barrier layer". The combination of silicon wafer layer 4, insulating layer 6, and device layer 8 may together form an SOI type device, for example. The insulating layer 6 may be formed of an oxide of the wafer material, for example silicon oxide (which may be obtained simply by exposing the wafer layer 4 to air at elevated temperatures, for example). Silicon nitride and/or silicon oxynitride may also be used for the insulating layer 6 (diffusion barrier layer). Other materials that are insulating and which inhibit the diffusion of the impurities from the silicon wafer layer 4 to the device layer 8 may also be used.

The silicon wafer layer 4 is impregnated with impurities that produce deep energy levels, thereby increasing the resistivity of the silicon wafer layer 4.

The concentration of deep level impurities may be chosen to be in the range of $10^{13}$ to $10^{18}$ cm$^{-3}$. Preferably, the concentration is in the range of $10^{14}$ to $10^{17}$ cm$^{-3}$. More preferably, the concentration is in the range of $10^{14}$ to $10^{16}$ cm$^{-3}$. The impurities may preferably increase the resistivity to at least 1 kΩcm, more preferably to at least 2 kΩcm, more preferably to at least 4 kΩcm, more preferably to at least 10 kΩcm, at the operating temperature of the high frequency device, for example at about 293 K, 323 K or 353 K. Preferably, the impurities may increase the resistivity to at least 100 kΩcm at room temperature. Any combination of the above concentrations, resistivities and temperatures may be used.

The impurities are effective to increase the resistivity because they act to compensate for shallow donor and acceptor levels that arise in the band gap of the material (e.g. silicon) of the substrate layer 4 due to background impurities (also referred to as "shallow level dopants") introduced during the manufacturing process of the silicon wafer layer 4. For example, where the Cz technique is used to fabricate the silicon wafer layer 4, shallow level dopants such as phosphorous and boron are common. It is extremely difficult to eliminate such background impurities from the manufacturing process. Other shallow levels may also be introduced during the manufacturing process. For example, thermal donors may be formed during the processing of Cz silicon and these will also be compensated by the intentionally introduced deep level impurities.

In general, the effect on the resistivity of the impurities which are deliberately added to increase the resistivity will depend on the type of impurity and on the concentration of the impurity. The type of impurity determines the nature of the energy levels that the impurity introduces into the band structure of the material forming the silicon wafer 4. Broadly speaking, where an energy level is formed which is relatively close to either the valence or conduction band, the effect of the impurity on the resistivity tends to vary significantly as a function of the concentration of the added impurity. On the other hand, where impurities are chosen which introduce energy levels deep within the band gap, a rise in resistivity is achieved over a broader range of concentrations of the added impurity. Impurities which introduce one or more energy levels deep within the band gap are referred to as deep level impurities and are in general preferred over shallower level impurities (which are nevertheless deep enough to provide some increase in resistivity) because the increased resistivity occurs over a broader range of concentrations and is also less sensitive to the concentration of the shallow level dopants that are being compensated.

Further details about the expected effect of different deep level impurities on the resistivity of Czochralski silicon can be found in the research paper Semicond. Sci. Technol. 18 (2003) 517-524, herein incorporated in its entirety by reference, the teaching of which can be applied to the impurities used in the present invention.

A number of potentially suitable deep level impurities exist. These include gold, silver, chromium, cobalt, palladium, platinum, vanadium and manganese. The effect on the resistivity of silicon of such materials has meant that they have traditionally been excluded from semiconductor manufacturing facilities because of the risk of contamination of silicon device layers. This is particularly true for gold and silver which have very high diffusivities, which increases the risk that they will find their way into the device layers. A possible exception is the fast switching diode, for which Au is deliberately introduced as a "lifetime killer" (to reduce minority carrier lifetime). However, this is unusual. In general, the presence of a lifetime killer is considered highly undesirable and great care is taken to avoid them. Embodiments of the present invention have been developed despite this commonly held fear in the field, based on the recognition that a broad class of devices are insensitive to the deep level impurities (e.g. passives) and that, for devices which are sensitive, careful positioning of the devices relative to impregnated wafers, careful design of substrates (e.g. to include diffusion barrier shields) and/or careful choice of manufacturing sequences can sufficiently reduce the risk of performance disruption due to contamination of device layers by the deep level impurities.

The deep-level impurities may be chosen so that the impurity energy levels pin the Fermi level near the middle of the band gap. The pinning of the Fermi level in this way may prevent the production of an inversion layer that is sometimes produced in SOI wafers adjacent to the dielectric layer. This is a significant problem as the inversion layer may otherwise reduce the effective substrate resistance in high resistivity silicon substrates with low background doping and can be a particular problem when float-zone material is used in this role.

Whether or not the energy level introduced by a given impurity is deep enough to increase the resistivity of the silicon wafer layer will depend on the nature of the silicon wafer layer 4 and how it was manufactured (i.e. on which shallow level dopants are intrinsically present and in which concentrations—both the energy level of the impurity and its concentration are relevant factors). However, it is typically expected that impurities having energy levels which are more than 0.3 eV deep in the band gap (the relevant depth being the energy difference between the deep level and the conduction band for donor states and between the energy level and the valence band for acceptor states) would be suitable. Larger separations (i.e. deeper energy levels) generally produce higher resistivity material over a larger range of concentrations. As an example of a suitable concentration for a particular application, theory suggests that a concentration of $5\times10^{13}$ $cm^{-3}$ of boron would require about $10^{15}$ $cm^{-3}$ of gold to produce satisfactory compensation. However, a higher concentration of Au would result in an even higher resistivity. The inventors have found that compensation works better for n-type rather than p-type material. Therefore, it may be desirable to start with an n-type material (e.g. phosphorous doped) of about $1\times10^{14}$ $cm^{-3}$. This approach can result in resistivities greater than 100 kOhmcm at room temperature.

Deep level impurity dopants are found to fall into two broad categories according to the nature of compensation produced. For the addition of Au or Ag to p-type substrates, the resistivity saturates with increasing concentrations of the deep dopant, whereas for Mn and V the resistivity peaks and then tails off quickly with increasing deep dopant concentration. The different behaviour is due to the presence of both acceptor and donor states very near mid-gap for the first category of impurities, whilst the second type only have a single type of level very near mid-gap. The first category of impurities can trap both electrons and holes and are thus able to compensate, for example, for the presence of residual boron atoms in Cz—Si and also any thermal donors which might be formed during processing. The second category can only compensate for a single carrier type. From this picture, using the first category of dopants, for which resistivity saturates at high impurity concentrations, it can be easier to achieve uniformly high resistivity in the substrate without requiring precise control over the spatial distribution of the compensating deep impurity concentration.

The properties of Au make it a particularly promising candidate for the deep level impurity. Assuming that a minimum guaranteed concentration of residual B that can be achieved in Cz—Si, at reasonable economic cost, is $5\times10^{13}$ $cm^{-3}$, it is expected that introduction of about $10^{16}$ $cm^{-3}$ Au atoms into the silicon wafer will achieve a resistivity greater than about 3 kΩcm at room temperature.

From the solubility of Au in Si, calculated using thermodynamic data and an experimentally derived phase diagram, it is expected that temperatures of around 1000° C. would be required to introduce gold concentrations up to $10^{16}$ $cm^{-3}$, whilst at 1200° C. the solubility is around $10^{17}$ $cm^{-3}$, much more than sufficient to compensate low B doped Cz—Si, although the effects of clustering may become relevant at these higher concentrations (see below).

Diffusion of Au in bulk Si occurs by either the dissociative Frank-Turnbull mechanism or by the kick-out mechanism. At temperatures above around 800° C., the kick-out mechanism dominates. Au diffuses very quickly as an interstitial but its interstitial solubility is very low whereas substitutional Au is a slow diffuser, but has a much higher solubility. Thus the transport of Au involves three stages: i) rapid interstitial diffusion, ii) the interchange between interstitial and substitutional states by the kick-out mechanism, which creates a super saturation of self-interstitials and finally, iii) the out-diffusion of these self-interstitials to the Si surface, which is normally assumed to act as an infinite sink. This last step is usually rate limiting and results in a "U-shaped" concentration profile (i.e. with higher concentrations near the surfaces of the Si and a lower concentration trough towards the centre of the Si away from the surfaces), typical of Au diffusion in Si. More generally, the U-shaped concentration profile will arise for Au, Pt, Zn, for example, which diffuse by the Kick-out mechanism, and Ni, for example, which diffuses via the Frank Turnbull mechanism.

The effective diffusivity of Au does not depend on the diffusivity of any Au species, but only on the diffusivity of Si self-interstitials and the equilibrium concentrations of Si self-interstitials and substitutional Au. Transport of Au to both surfaces of silicon wafers, from a single surface, is rapid but it takes longer for the Au concentration in the centre of the silicon wafer to reach its solid solubility value.

The resistivity of Si can be calculated for different concentrations of Au according to the compensation mechanism detailed in K. Mallik, R. J. Falster, and P. R. Wilshaw, Semiconductor Science Technology, 2003. 18: p. 517. When this analysis is combined with expressions for Au concentration obtained after diffusion, the resistivity at any depth in a silicon wafer can be calculated. For example, assuming a silicon wafer with a background B concentration of $5 \times 10^{13}$ cm$^{-3}$, and using values for the Au donor and acceptor energy levels of $E_v+0.35$ and $E_c-0.55$ eV, resistivity in excess of 3 kΩcm should be possible throughout the silicon wafer, after an anneal of 40 minutes at 1050° C.

A number of standard approaches are available for incorporating the deep level impurity atoms. For example, the impurities may be deposited on the surface of a raw wafer (e.g. a Cz-produced single crystal silicon wafer) in a concentrated form and left to diffuse into the bulk at elevated temperatures. The speed of this process could be increased by increasing the temperature, for example. Alternatively, ion implantation may be used to "fire" (project) impurities into the silicon wafer followed by anneal to in-diffuse the impurities.

The device layer 8 may be formed using an additional silicon wafer. In a first step, the silicon wafer 4 and the additional silicon wafer are oxidised so as each to be covered by an oxide layer (layer 6 on the silicon wafer 4). The oxidised wafers are then brought into contact with each other and heated so that a glass is formed from the oxide in the region between the silicon wafers. The glass acts to bond the silicon wafers together and also constitutes a diffusion-barrier-insulating layer. The upper surface may then be cut to expose a clean layer of silicon within which electronically functional device structures may be formed to create the device layer 8. In the example described, both silicon wafers are oxidized before they are bonded together. However, according to a variation, only one of the two silicon wafers may be oxidized prior to bonding.

The diffusion barriers must prevent the transport of deep level impurities (e.g. Au) through the layers for the thermal budget which is necessary for device processing after the deep level impurities have been introduced. This will vary according to the stage of the processing at which the deep level impurities are introduced and the nature of the devices to be fabricated.

It is expected that a 147 nm thick thermal silicon oxide layer could work as an effective diffusion barrier for Au for 1 hour at 1000° C., but would fail at 1050° C.

Alternatively or additionally, the device layer 8 may comprise passive electronic components (such as resistors, capacitors or inductors) that are not affected by the deep level impurities. Such passive electronic components may be formed directly on the silicon wafer 4 or on a dielectric layer deposited on the surface of the silicon wafer 4.

In order to have the effect of increasing the resistivity of the silicon wafer in the manner discussed above, the deep level impurity must introduce one or more "deep energy levels" within the band gap of the silicon. These "deep energy levels" must be separated in energy by at least 0.3 eV from the relevant band. For donor states or levels, the relevant band is the conduction band whereas for acceptor states or levels, the relevant band is the valence band. Thus, a donor level is a deep energy level if it is separated from the conduction band by at least 0.3 eV (regardless of how close it may be to the valence band). Similarly, an acceptor level is a deep energy level if it is separated from the valence band by at least 0.3 eV (regardless of how close it is to the conduction band).

In order for the deep level impurities to be effective to raise the resistivity of the silicon wafer, they must reach substitutional sites (at which point, they may be referred to as "active"). The precipitation of oxide during the impregnation process can reduce the number of deep level impurities that reach substitutional sites. The precipitation of oxide after the impregnation process can cause the ejection of deep level impurities from substitutional sites, thus reducing the concentration of active deep level impurities. The process is described in further detail below for the case of Au in silicon, but is also applicable for other deep level impurities (e.g. Pt, Zn, and Ni). In Au, Pt and Zn, the Kick-out mechanism is the rate limiting step, but the Frank-Turnbull would give the same effects (e.g. for Ni). In the latter, the rate limiting step is the in-diffusion of vacancies from a surface, while for the Kick-out mechanism, the rate limiting step is out-diffusion of interstitials to a surface.

For Au in silicon, the impregnation process is achieved by diffusing Au (for example from a surface evaporated layer, or from a surface ion implanted layer) into the bulk of the silicon wafer. This diffusion process occurs via the kick-out mechanism whereby Au interstitials with low solubility, but rapid diffusivity, rapidly saturate the thickness of the silicon wafer. They can move on to substitutional sites by "kicking out" Si atoms which then become self interstitials. There thus exists a local equilibrium $Au_i+Si_s \leftrightarrow Au_s+Si_i$. The $Au_s$ has low diffusivity and is essentially immobile but has a much higher solubility than $Au_i$. If the $Si_i$ does not move away when produced then the local concentration increases and the equilibrium reaction is driven towards the left which prevents further $Au_i$ moving onto the substitutional sites. It is the $Au_s$ that has the desired electrical activity to trap free carriers (electrons or holes) so as to produce high resistivity material. In general there needs to be as much $Au_s$ as the potential free carrier concentration and ideally at least about an order of magnitude more in order to produce sufficiently high resistivity material.

Cz Si contains oxygen which originates from the quartz crucible used to contain the melt from which the single crystal is grown. After the single crystal ingot is solidified this oxygen is supersaturated and, upon cooling as the remainder of the ingot is grown, some of it will nucleate small clusters/ precipitates in the bulk of the material. Upon further heat treatment, for example during Au in-diffusion or subsequent device processing, the supersaturated oxygen grows bigger clusters/precipitates around these pre-existing clusters/nuclei. This growth of precipitates releases $Si_i$ into the bulk of the material. The growth of these precipitates is very uncontrolled and depends on the thermal history of the silicon wafer after solidification, which varies from one position in the ingot to another, the oxygen concentration which strongly determines nucleation rates, and the subsequent heat treatment which will depend on the conditions used for Au in diffusion and what heat treatments are needed to fabricate whatever electronic devices are to be made.

The inventors have discovered that when Si wafers with uncontrolled oxygen content and distribution are used, the resistivity of in-diffused Au wafers is not reproducible. It is believed that this is due to the production and growth of oxide precipitates, the release of $Si_i$ from which shifts the position of the $Au_i + Si_s \leftrightarrow Au_s + Si_i$ equilibrium to the left. If this occurs during in diffusion then insufficient Au is introduced. If this happens subsequently then $Au_s$ is lost. Both result in a loss of resistivity, are essentially uncontrollable, and would render commercial, reproducible processing difficult, or even unrealistic.

Figure 2:
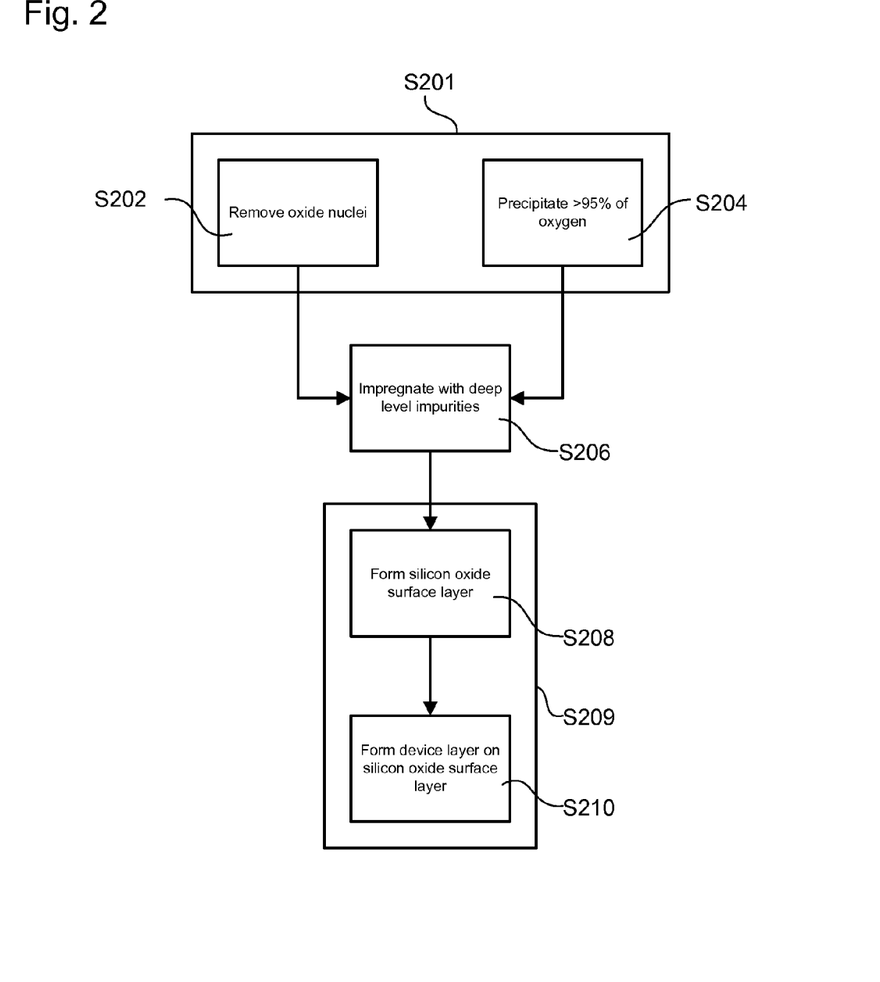
FIG. 2 is a schematic illustration of an example method for manufacturing the substrate of FIG. 1.

FIG. 2 illustrates schematically a methodology for avoiding the above problems.

In step S201, the silicon wafer is subjected to a pre-processing step, which modifies the properties of the silicon wafer such that oxide precipitation during or after impregnation with the deep level impurities (e.g. in diffusion of Au) is suppressed to a level that is lower than it would have been had the pre-processing not been carried out, preferably to a level at which any oxide precipitation that does occur has no significant affect on the high resistivity properties of the impregnated silicon wafer, and thus on the performance of any electronic circuit fabricated using the silicon wafer.

Two example approaches are disclosed.

Firstly (step S202), the silicon wafer may be processed to remove all, or nearly all, the small oxide clusters/nuclei present after the ingot is grown. This can be achieved using a homogenisation treatment which dissolves or breaks up any pre-existing clusters and distributes the oxygen atoms uniformly through the silicon wafer. The homogenisation treatment typically consists of giving the silicon wafer a short anneal at a temperature of say 1000 C or above and then rapidly cooling the silicon wafer back to a lower temperature. The silicon wafer may be cooled to below 650 degrees C. in about 10 minutes or less, for example. At 1000 C or above the small oxide nuclei/precipitates are unstable and dissolve to produce a nearly homogeneous oxygen distribution throughout the silicon wafer. Rapid cooling ensures that no (or a negligible number of) new oxide clusters/nuclei are produced. Subsequent device processing will typically occur at temperatures that are sufficiently low that the time required to produce new clusters/nuclei will be extremely long: precipitation (and the associated injection of silicon self interstitials) is thus effectively suppressed. A more detailed example approach is described below with reference to FIG. 3.

Secondly (step S204), all, or nearly all, the oxygen can be purposely precipitated prior to the impregnation with the deep level impurities (e.g. Au in-diffusion). For example, the pre-processing may be such as to precipitate oxide until the concentration of remaining unprecipitated oxygen is less than $10^{17}$ cm$^{-3}$, more preferably less than $5 \times 10^{16}$ cm$^{-3}$, more preferably less than $10^{16}$ cm$^{-3}$. In this way, all $Si_i$ that is injected by the oxide growth and which could in principle interfere with the deep level impurities will migrate to the surfaces of the silicon wafer and leave the system before the impregnation step. Details of how this process may be implemented are given below with reference to FIG. 4.

In alternative embodiments, the step of purposely precipitating all, or nearly all, the oxygen can be carried out after the impregnation step. In this case, the precipitation may produce a large quantity of interstitials, which in the short term would knock the deep level impurity atoms off the substitutional sites (which is what it is desirable to avoid). It would therefore be beneficial in this scenario to carry out a "reactivation anneal", consisting of maintaining the silicon wafer at an elevated temperature, after the precipitation has slowed or stopped, to allow the deep level impurities to return to the substitutional sites (in the same way as when the deep level impurities were in-diffused during the impregnation step). Thus, the sequence in this scenario would be: i) impregnation; ii) precipitation; and then iii) reactivation anneal.

In step S206, the process of impregnating the silicon wafer with deep level impurities is carried out (i.e. after the pre-processing S201). This involves heating the substrate to temperatures which, in the absence of the pre-processing S201, would cause growth of oxide precipitates, which would interfere with the impregnation process and make it difficult to obtain a reproducible concentration of deep level impurity within the silicon wafer.

In step S209, the silicon wafer is processed further to form the electronic device required. For example, a silicon oxide surface layer is formed (S208) and a device layer is formed on the silicon oxide surface layer (S210). Such further processing would typically involve exposing the silicon wafer to elevated temperatures which, in the absence of the pre-processing S201, could cause growth of oxide precipitates and a reduction in resistivity.

The order of steps shown in FIG. 2 is exemplary and not limiting. The steps may be carried out in different orders. For example, step S206 (impregnation with deep level impurities) could be carried out during or before step S201 (pre-processing). Additionally or alternatively, step S209 (formation of the device layer) could be performed before, during or after step S206 and/or before, during or after step S201. The step S209 is shown as comprising two specific steps S208 and S210 in the example of FIG. 2, but different processing steps could be used.

Additionally, in the case where the formation of the device layer is carried out in the context of an SOI structure, the steps of impregnation with deep level impurities (S206) and/or pre-processing (S201) could be carried out on the handle wafer either before or after bonding of the handle wafer to the wafer that will form the device layer.

Figure 3:
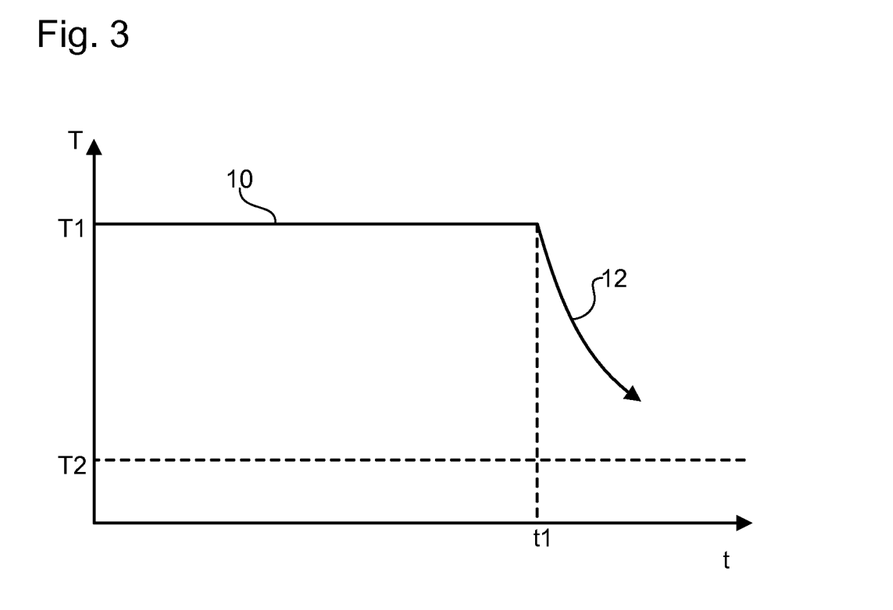
FIG. 3 is a schematic illustration of a heat treatment suitable for use in a pre-processing step for suppressing precipitation of oxide during or after impregnation of deep level impurities.

FIG. 3 is a graph of temperature T (vertical axis) against time t (horizontal axis) showing schematically one example approach for carrying out the process of step S202. In a first step 10, the silicon wafer is held at a temperature T1 for time t1, T1 and t1 being chosen such that a large proportion of the oxide clusters/nuclei dissolve during this first step 10, preferably an amount that is sufficient to ensure that there are insufficient clusters/nuclei remaining to give significant precipitation in subsequent processing steps. The temperature T1 may be between 900 and 1250 degrees C. for example, preferably between 1000 and 1100. The time t1 may be between 30 seconds and 60 minutes, for example, preferably between 1 minute and 30 minutes.

In the second step 12, the silicon wafer is cooled from T1 to a lower temperature, T2. The cooling is sufficiently rapid that no, or very few, new oxide clusters/nuclei can form during the cooling process. Typically, it is expected that cooling from T1 to below about 700 degrees C. should be achieved in about 10 minutes or less. The cooling rate from then on is less important because the rate of formation of new oxide clusters/nuclei would already be very slow. The final temperature T2, for example room temperature, is too low for oxide clusters/nuclei to form to any significant extent.

Figure 4:
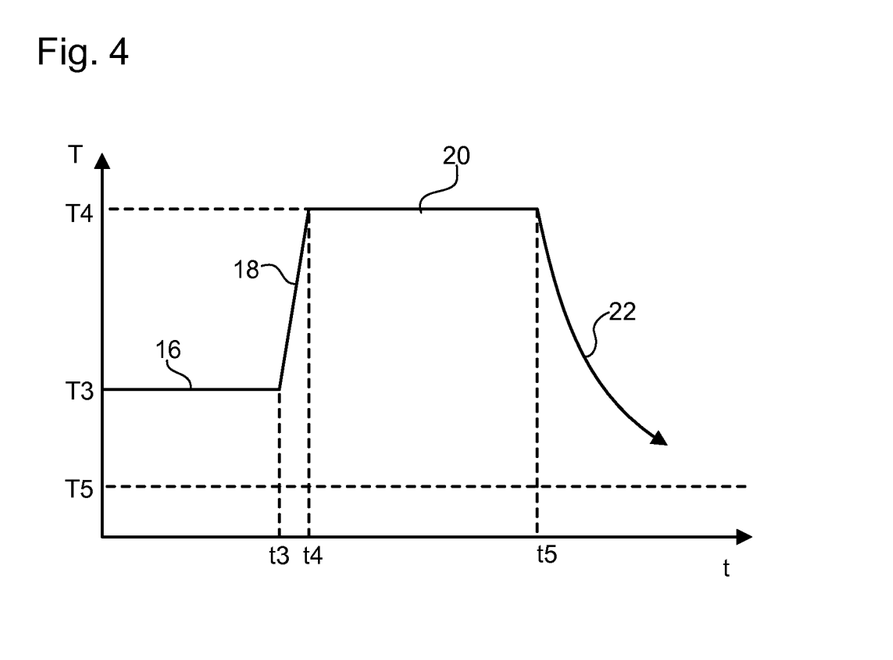
FIG. 4 is a schematic illustration of an alternative heat treatment suitable for use in a pre-processing step for suppressing precipitation of oxide during or after impregnation of deep level impurities.

FIG. 4 is a graph of temperature T (vertical axis) against time t (horizontal axis) showing schematically one example approach for carrying out the process of step S204, which involves deliberately precipitating substantially all of the oxygen in the silicon wafer as oxide. In a first phase 16, which may be referred to as a nucleation step, the silicon wafer is held at a temperature T3 for time t3, T3 and t3 being chosen so that the number of oxide clusters/nuclei in the silicon wafer is greatly increased during this step. For example, T3 may be between 400 and 750 degrees C., for example, and t3 may be between 30 minutes and 24 hours, for example. The silicon wafer is then heated (step 18) to temperature T4, where it is held (step 20, also referred to as a precipitation step) for a period t5-t4, T4 and t5 being chosen such that the concentration of unprecipitated oxygen remaining is less than $10^{17}$ $cm^{-3}$, preferably less than $5 \times 10^{16}$ $cm^{-3}$, or more preferably less $10^{15}$ $cm^{-3}$. T4 may be greater than 950 degrees C., for example, and t5-t4 may be greater than 1 hour, for example. Finally, the silicon wafer is allowed to cool back to a lower temperature T5 (step 22).

As an alternative to the approach described with reference to FIG. 4, a three stage anneal process may be used. In this arrangement a first anneal ("nucleation step") nucleates the precipitates, a second anneal ("drift anneal step") at around 800 degrees C. for about 1 hour grows and stabilises the larger clusters/nuclei which have already been formed, and then a third anneal ("precipitation step") at around 1000 degrees C. or above is applied for the main precipitate growth. The range of possible times and temperatures for each anneal is large and can depend sensitively on the starting concentration of oxygen in the silicon wafer. For example the nucleation rate can depend on the fifth power, or greater, of the oxygen concentration. The purpose of the drift anneal is to get growth of the larger nuclei to a sufficient size that when the temperature is then raised to 1000 C or above they do not re-dissolve. For example, the drift anneal step may be configured such that a majority of the clusters/nuclei that are formed in the nucleation step grow sufficiently that they will not re-dissolve in the precipitation step. Very small clusters/nuclei (like those present after ingot growth) will tend to dissolve when exposed to high temperatures.

The inventors have found that thermal anneals of silicon doped with Au can cause a thin Au rich layer to be produced at the surface of wafers. This layer is to some extent conductive and would reduce the effective resistivity of the wafer if it were to be used as a substrate in a device. Such a layer can be observed after an anneal to impregnate the silicon wafer with the Au for example, depending on the cooling rate after this anneal. The inventors have found that this Au rich layer can be removed by chemical etching in, for example, aqua regia or an aqueous potassium iodide/iodine solution. In an example it was found that a piece of Au doped silicon that showed an effective resistivity of ~50 kohm cm when measured using a four point contact method immediately after an impregnation anneal, showed a resistivity of ~150 kohm cm when re-measured after using a Au removing etch. However, if the wafer has a surface layer of another material, for example silicon oxide or a III-V semiconductor, then the Au rich layer can form at the interface between the two materials and in this case cannot be removed by a chemical etch. The application of a short, high temperature anneal followed by a rapid cool, for example as routinely used in Rapid Thermal Anneals (RTAs), can remove the Au rich layer by redistributing the Au deeper into the silicon. This process may be carried out on silicon either with or without the presence of surface layers of another material. The duration of this anneal step will typically be two to five minutes at a temperature of approximately 1150 C. The cooling rate after such an anneal should be greater than about 40 C per minute down to a temperature of around 650 C. Below about this temperature the cooling rate can be slower.

It has been found that annealing Au containing Si at high temperatures can induce clustering of the Au which reduces the number of deep levels in the material associated with the impurity. This process can change the resistivity of the material in an undesired way. These clusters of Au can be broken up by a relatively short, high temperature anneal at a temperature such that the concentration of Au in the material (including that in both the substitutional and clustered state) is below the solid solubility for Au in silicon at that temperature. An example of such an anneal to break up Au clusters would be 1000 C for 20 minutes.

As has been described above, the precipitation of oxygen present in a silicon wafer can lead to the injection of silicon self interstitials that displace Au atoms lying on substitutional sites so as to move them onto interstitial sites which may change the resistivity of the material in an undesired way. The rate of oxygen precipitation is strongly dependent on (amongst other things) the concentration of oxygen interstitials present in the wafer. This concentration can be reduced by purposely precipitating much of the oxygen before Au is introduced into the wafer but it can also be reduced by the selection of Czochralski wafers that have been grown using the so called magnetic Czochralski process. In this process a strong magnetic field is applied to the silicon melt during ingot growth. This has the effect of damping convective currents in the melt which in turn reduces the amount of oxygen interstitials incorporated into the growing ingot. Typical oxygen concentrations in standard Czochralski (CZ) silicon are above $7 \times 10^{17}$ $cm^{-3}$ whereas for magnetic Czochralski (MCZ) silicon they are normally below $5 \times 10^{17}$ $cm^{-3}$. MCZ silicon is sometimes used where it is wished to suppress thermal donor generation (thermal donors are electrically active oxygen complexes whose rate of generation increases with increasing interstitial oxygen concentration). However, this functionality will not normally be relevant in the present application because the Au deep levels will effectively compensate for the thermal donor energy levels. The production of MCZ wafers is also more expensive than standard CZ wafers and MCZ wafers are mechanically weaker (their yield strength may be as much as 15% lower). Nevertheless, the inventors have recognised that the benefits described above in terms of reducing the displacement of substitutional Au onto interstitial sites make it attractive to use MCZ wafers for high resistivity Au doped silicon substrates despite the extra cost involved and the mechanically weaker material produced.

In the above description, detailed references are made to silicon, and in particular Czochralski silicon, as the material forming the wafers that are impregnated with deep level impurities. However, the embodiments are not limited to silicon: other materials in which the resistivity can be increased by impregnation with deep level impurities can be used as the wafer in any of the embodiments described.

Any of the aspects of the invention can be combined together in any combination.

The invention claimed is:
1. A method of processing a silicon wafer for use in a substrate for an electronic circuit, comprising:

impregnating the silicon wafer with impurities that form one or more deep energy levels within the band gap of silicon, wherein at least one of said deep energy levels is positioned at least 0.3 eV away from the conduction band if the level is a donor level or at least 0.3 eV away from the valence band if the level is an acceptor level; and pre-processing the silicon wafer, prior to or after said impregnation step, so that precipitation of oxide during, after, or during and after, said impregnating step is suppressed wherein said pre-processing comprises removing the oxide clusters/nuclei to a level that is insufficient to give rise to significant precipitation in subsequent processing steps;

wherein said pre-processing comprises a heat treatment that dissolves all or a proportion of oxide clusters/nuclei present before said pre-processing;

wherein said heat treatment is followed by a cooling that is sufficiently rapid to prevent significant creation of new oxide clusters/nuclei during the cooling process; and wherein said cooling comprises reducing the temperature of the silicon wafer to below 650 degrees C. in less than ten minutes.

2. A method according to claim 1, wherein said pre-processing comprises precipitating oxide until the concentration of remaining unprecipitated oxygen is less than $10^{17}$ cm$^{-3}$.

3. A method according to claim 2, wherein said pre-processing comprises a nucleation step effective to increase the number of oxide clusters/nuclei that are present in the silicon wafer.

4. A method according to claim 3, wherein said nucleation step comprises maintaining said silicon wafer at a temperature between 400 and 750 degrees C. for a period of between 30 minutes and 24 hours.

5. A method according to claim 2, wherein said pre-processing comprises a precipitation step that is effective to cause growth of oxide at the oxide clusters/nuclei such that the concentration of remaining unprecipitated oxygen is less than $10^{17}$ cm$^{-3}$.

6. A method according to claim 2, wherein said precipitation step comprises maintaining said silicon wafer at a temperature greater than 950 degrees C. for a period greater than 1 hour.

7. A method according to claim 6, wherein said pre-processing comprises a nucleation step effective to increase the number of oxide/nuclei that are present in the silicon wafer, the method further comprising a drift anneal step, between said nucleation step and said precipitation step, said drift anneal step being configured to cause a majority of the clusters/nuclei formed in said nucleation step to grow sufficiently that they do not dissolve during said precipitation step.

8. A method according to claim 1, wherein the silicon wafer is formed from silicon grown using the magnetic Czochralski method.

9. A method according to claim 1, further comprising, after the impregnating step:
removing a layer at the surface of the silicon wafer by etching; or
performing an anneal to redistribute said impurities away from a surface layer.

10. A substrate for an electronic circuit comprising a silicon wafer processed according to claim 1.

11. A substrate according to claim 10, further comprising:
a diffusion barrier layer, formed on a surface of the silicon wafer and providing an outer surface on which a device layer may be formed, said diffusion barrier layer having the property of substantially preventing diffusion of said impurities through it.

12. A substrate according to claim 10, further comprising a device layer comprising electronically functional components.

13. A substrate according to claim 10, wherein said impurities include one or more of the following: gold, silver, chromium, cobalt, palladium, platinum, vanadium and manganese.

14. A substrate according to claim 10, wherein said silicon wafer is formed from Czochralski silicon.

15. A substrate according to claim 10, wherein the concentration of said impurities is in the range of $10^{13}$ to $10^{18}$ cm$^{-3}$.

16. A device manufacturing method, comprising the following steps:
impregnating a silicon wafer with impurities that form one or more deep energy levels within the band gap of silicon, wherein at least one of said deep energy levels is positioned at least 0.3 eV away from the conduction band if the level is a donor level or at least 0.3 eV away from the valence band if the level is an acceptor level; and forming a device layer comprising electronically functional components;

wherein the silicon wafer is pre-processed, prior to or after said impregnating step, so that precipitation of oxide during, after, or during and after, said impregnating step is suppressed;

wherein said pre-processing comprises removing the oxide clusters/nuclei to a level that is insufficient to give rise to significant precipitation in subsequent processing steps;

wherein said pre-processing comprises a heat treatment that dissolves all or a proportion of oxide clusters/nuclei present before said pre-processing;

wherein said heat treatment is followed by a cooling that is sufficiently rapid to prevent significant creation of new oxide clusters/nuclei during the cooling process; and wherein said cooling comprises reducing the temperature of the silicon wafer to below 650 degrees C. in less than ten minutes.

* * * * *